United States Patent [19]

Shahraray et al.

[11] Patent Number: 5,559,710
[45] Date of Patent: Sep. 24, 1996

[54] APPARATUS FOR CONTROL AND EVALUATION OF PENDING JOBS IN A FACTORY

[75] Inventors: Maryam S. Shahraray, Freehold, N.J.; Khosrow Hadavi, Dallas, Tex.

[73] Assignee: Siemens Corporate Research, Inc., Princeton, N.J.

[21] Appl. No.: 563,911

[22] Filed: Nov. 22, 1995

(Under 37 CFR 1.47)

Related U.S. Application Data

[63] Continuation of Ser. No. 22,250, Feb. 5, 1993, abandoned.
[51] Int. Cl.[6] ............................................ G06F 19/00
[52] U.S. Cl. ............... 364/468.06; 364/194; 364/401 R
[58] Field of Search .................................. 364/468, 478, 364/401, 402, 403, 194

[56] References Cited

U.S. PATENT DOCUMENTS

| | | | |
|---|---|---|---|
| 4,309,600 | 1/1982 | Perry et al. | 235/375 |
| 4,346,446 | 8/1982 | Erbstein et al. | 364/551 |
| 4,736,306 | 4/1988 | Christensen et al. | 364/513 |
| 4,818,113 | 4/1989 | Patel | 366/76 |
| 4,846,928 | 7/1989 | Dolins et al. | 156/626 |
| 4,852,001 | 7/1989 | Tsushima et al. | 364/401 |
| 4,887,218 | 12/1989 | Natarajan | 364/468 |
| 4,896,269 | 1/1990 | Tong | 364/468 |
| 4,956,784 | 9/1990 | Hadavi et al. | 364/403 X |

FOREIGN PATENT DOCUMENTS

| | | |
|---|---|---|
| 136778 | 7/1979 | Germany . |
| 60-100850 | 6/1985 | Japan . |
| 415674 | 4/1974 | U.S.S.R. . |
| 401903 | 11/1975 | U.S.S.R. . |

OTHER PUBLICATIONS

"A comparison of two order releasing mechanisms (production control)", Ragatz et al., Proceedings of the 16th Annual Meeting of the American Institute for Decision Sciences, 1984, Toronto, Ont., Canada, 5–7 Nov. 1984.

"Analysis of a heuristic for one machine sequencing with release dates and delivery times", Oper. Res. (USA), vol. 28, No. 6, pp. 1436–1441, Nov.–Dec. 1980.

"Simulation of job shop and assembly line balancing problems by resource–constrained project scheduling methods", Kurtulus, Found. Control Eng. (Poland), vol. 6, No. 3, pp. 145–160, 1981.

(List continued on next page.)

*Primary Examiner*—Joseph Ruggiero
*Attorney, Agent, or Firm*—Adel A. Ahmed

[57] ABSTRACT

An improved system and method for scheduling a plurality of orders into a factory for processing by one or more of a plurality of machines located therein, based on the use of a Continuity Index job release strategy. The system and method is particularly addressed to the enhancement of such a job release strategy by introduction of Factory Profile and priority criteria and an algorithm for automatic determination of an optimum job release point based on such criteria. The scheduling methodology is characterized by defining a Continuity Index (CI) for each of the jobs as the ratio of the actual time the job is being processed by such one or more machines to the total time from release of the jobs into a shop wherein such machines are located until the completion of the job, establishing a Factory Profile curve of optimum CI value over time, determining a curve of actual CI for each of the jobs being tested for release beginning from a trial start date and extending through the expected completion of the job, comparing the actual CI curve for each of such jobs with the Factory Profile optimum CI curve and accepting the job for processing by the shop on the trial start date if the actual CI curve closely follows the Factory Profile curve throughout the processing time for the job, and otherwise determining a new curve of actual CI for the job from a new trial start date and repeating the comparison.

8 Claims, 10 Drawing Sheets

OTHER PUBLICATIONS

"Orderbook balancing using a combination of linear programming and heuristic techniques", Jain et al., Interfaces (USA), vol. 9, No. 1, pp. 55–67, Nov. 1978.

"Concurrent scheduling in flexible automation", Mirchandani et al., Proceedings of the 1988 IEEE International Conference on Systems, Man, and Cybernetics (IEEE Cat. No. 88CH2556-9), IEEE 1988, Beijing and Shenyang, China, 8–12 Aug. 1988.

"A new approach to performance analysis of closed queuing networks", Aicardi et al., 1988 International Conference on Computer Integrated Manufacturing, ALCOA, Digital Equip. Co. Eastman Kodak et al., 1988, Troy, NY, USA, 23–25 May 1988.

"A within-cell utilization based heuristic for designing cellular manufacturing systems", Ballakur et al., Int. J. Prod. Res. (GB), vol. 25, No. 5, pp. 639–665, May 1987.

"Branch and bound scheduling in flexible manufacturing systems", Allasia et al., Autom. & Strum. (Italy), vol. 34, No. 11, pp. 151–156, Nov. 1986.

"Modeling FMS by closed queuing network analysis methods", Menga et al., IEEE Trans. Components, Hybrids & Manuf. Technol. (USA), vol. CHMT-7, No. 3, pp. 241–248, Sep. 1984.

APPARATUS FOR CONTROL AND EVALUATION OF PENDING JOBS IN A FACTORY

CROSS-REFERENCE TO RELATED APPLICATION

This is a continuation of Ser. No. 08/022,250 filed Feb. 25, 1993, abandoned.

FIELD OF THE INVENTION

This invention relates to a system and method for optimizing the scheduling of jobs in a factory, such as a job-shop or flow-shop type factory, and particularly to the application of the methodology for load balancing, early pruning and job searching.

BACKGROUND OF THE INVENTION

Shop floor scheduling is an important task in managing a production system. Various, sometimes conflicting objectives must be considered—for example, maximizing throughput; minimizing the average time orders spend in the factory, which reduces the amount of work in progress (WIP); maximizing the number of delivery dates met; maintaining inventory at a reasonable level; and maximizing the utilization of resources. One aspect of shop floor scheduling is controlling the release of pending jobs onto the shop floor—called lot release. Another aspect of shop floor scheduling—called lot dispatching—deals with the control of jobs already on the shop floor and is concerned with which lot of WIP is to be processed next when a machine becomes available.

Inherent in the establishment of a lot release strategy is a tradeoff between minimization of waiting times for WIP, and assuring that a sufficient backlog of work is available for the machines processing those jobs to avoid idle time at the machine between the completion of one job and the beginning of the next. Therefore a test is needed to answer the question at any given point as to whether a particular lot of work should be released or not. Although a number of such tests have been proposed, given the dynamic nature of factories, some deviation between predicted and actual results is inevitable. However, with a dynamic test guiding the lot release strategy, one can make changes in the strategy as strategy as the situation changes.

In a prior invention by the present inventors, patented as U.S. Pat. No. 5,170,355, entitled *Apparatus And A Method For Controlling The Release of Jobs From A Pool Of Pending Jobs Into A Factory*, issued Dec. 8, 1992, and assigned to Siemens Corporate Research, Inc. of Princeton, N.J., the assignee of the present invention, a method was disclosed for controlling the release of jobs from a pool of pending jobs into a factory comprising a plurality of machines processing jobs-in-progress in response to management objectives, based on a measure of "continuity index" as a test of whether a job is suitable for release or not. Such a continuity index (CI) is, informally, the ratio of job's actual processing time on one or more machines in the factory to the total time from release to completion of the job—i.e., processing time plus waiting time. In the referenced patent, it was shown that there exists an optimal CI value, CI*, and a range of values about CI* (the bounds thereof shown in FIG. 1 as CI*+ and CI*−), such that if a new job has a CI within this range, optimal performance can be maintained. This is illustrated in FIG. 1, which represents the product of machine utilization percentage (load factor) and percentage of orders completed on time plotted against CI.

Figure 1:
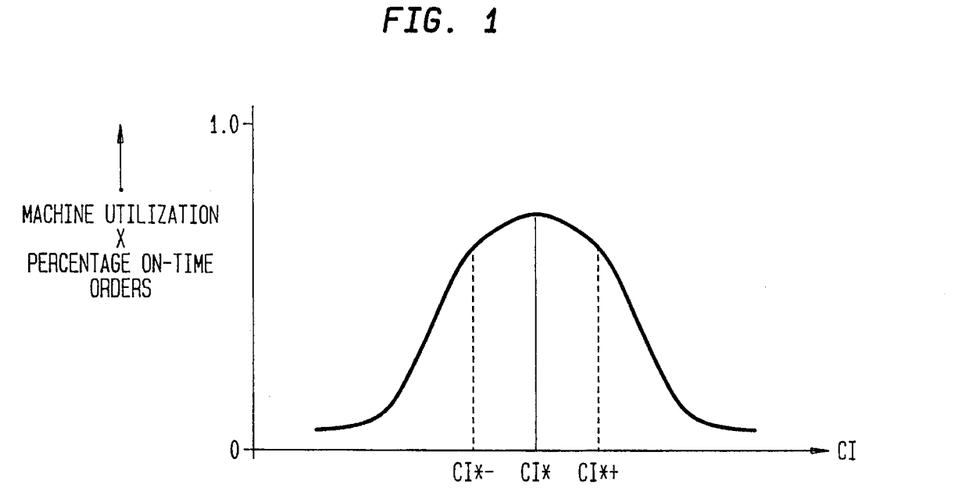
FIG. 1 is an illustrative plot of an operational parameter for a factory vs. continuity index for a prior art methodology.

From the curve shown in FIG. 1, it is apparent that the average continuity for all jobs should preferably be CI*. It also follows that each job which is released should contribute to this average in a way which is consistent with overall goals. Finally, as discussed in the referenced patent, the shape of the curve decides the sensitivity of the factory to changing CI. A flat top curve indicates that a wide range of WIP can yield optimal operating conditions and hence a good job mix can be achieved. A sharp peak, on the other hand, is a sign of sensitive environment, possibly due to the presence of certain critical and bottleneck work centers.

This invention relates to an improvement over the referenced patent wherein the lot release test is further refined to include (1) load balancing of the shop as a function of CI, (2) a relationship between job priority and CI and (3) the use of CI as a search guide for optimum release points. Applicants note that the prior art cited in the referenced patent is generally related to the improvement disclosed herein.

SUMMARY OF THE INVENTION

An improved system and method for scheduling the flow of orders into a factory based on the use of a Continuity Index job release strategy and particularly the enhancement of such a job release strategy by introduction of Factory Profile and priority criteria and an algorithm for automatic determination of an optimum job release point based on such criteria.

The method is addressed to the scheduling of a plurality of jobs among a plurality of machines, each of those jobs being processed by one or more of those machines, so as to optimize defined objectives, such as machine utilization and on-time job completion, and comprises the following steps:

defining a Continuity Index (CI) for each of the jobs as the ratio of the actual time the job is being processed by such one or more machines to the total time from release of the jobs into a shop wherein such machines are located until the completion of the job and output thereof from the shop;

establishing a Factory Profile curve of optimum CI value over time for the shop;

determining a curve of actual CI for each of the jobs being tested for release beginning from a trial start date and extending through the expected completion of the job in the shop;

comparing the actual CI curve for each of such jobs with the Factory Profile optimum CI curve and accepting the job for processing by the shop on the trial start date if the actual CI curve closely follows the Factory Profile curve throughout the processing time for the job, and otherwise determining a new curve of actual CI for the job from a new trial start date and repeating the comparison step.

DETAILED DESCRIPTION OF THE INVENTION

I. Load Balancing of the Shop

In job shops as well as factories where a variety of different process plans are involved in the production process, each incoming job has a different view of the shop. This means certain jobs may require a greater level of services at some work centers than for other work centers. Therefore, from a scheduling point of view, different treatment may be required for the different jobs. The term Factory Profile is used herein to refer to the "history" of a job's processing through a shop, and may be thought of as a "job's view" of the shop. Theoretically every order may have a different Factory Profile.

Figure 2:
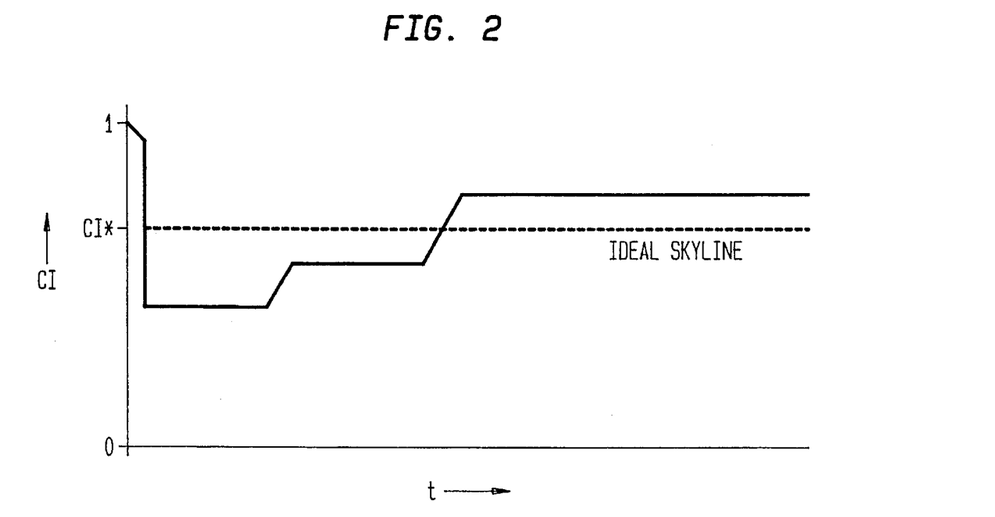
FIG. 2 illustrates a Factory Profile of an order being tested for release to the factory.

More concretely, the Factory Profile of an incoming order, j, is defined as a function fp(j,t) such that fp(j,T)=CI(j,T). This function represents a plot of CI vs. time as the order is scheduled at the time of its arrival, as shown in FIG. 2. The shape of the curve represents the "skyline"—or the complement, of the shop floor as seen from this job's point of view. The lower the value of CI, then the higher is the demand for the needed work centers for that job at that point in time. It should be noted that the profile of the shop is formed dynamically as the job is about to be released to the shop. From this, it follows that, at any time during the testing process—i.e., as to whether the job should be released or not, one can decide if the start date is a good choice or not. This criterion will be addressed in more detail below, but for now it suffices to say that the Factory Profile is formed at the time when the decision to release the job, or not to so release, is to be made.

An obvious question to ask here is: what is a good Factory Profile and what is a bad one? The answer to this question is critical to a determination of whether a job should be released or not. FIG. 2 shows that the ideal level is $CI^*$. This value corresponds to a "load balanced" factory (from this job's point of view) so that the job can start and finish with expected "perfect continuity." In order to determine the error, or deviation from such "perfect continuity" at a given point in time, use is made of the notion of sum of squares. Let time be divided into a number of intervals (possibly unequal), each of length $T_i$ so that at the end of each time interval, $CI_i=CI(t_i)$ is the value of CI for the job in time window, i; thus $$t = \sum_i T_i.$$

Designating $CI_t$ as the mean CI of the job order at time t, then the residual error at $t$ is $e(t) = \sum_{i=1 \ldots n} (CI_i - CI^*)^2$ and the regression error at $t$ is $g(t) = \sum_{i=1 \ldots n} (CI^* - CI_t)^2$ The goal, of course, is that the error should be minimized at the time of job release. However as the test for release is going on, the value of CI is updated as t increases. If the Factory Profile function is not good enough the value of $e(t)$ is going to become large enough so that at a point in time, t', the tester knows that there is no point in going any further. Continuation would only increase the error. This fact can therefore be used to terminate the test and try a different start date. For this reason the method of the invention is only concerned with the residual error.

In the referenced patent, optimal results were shown to be obtained with the CI release strategy using a range of CI values. Applying this concept to the Factory Profile, an upper bound of such an acceptable CI range will be defined as $CI^*+$ and the lower bound defined as $CI^*$. With the introduction of this acceptance-band for CI, the error at time t of a job can be redefined as:

$$\begin{aligned} e(t) &= 0 \text{ if } CI^*- \leq CI_i \leq CI^*+ \\ &= \sum_{i=1 \ldots n} \text{MIN}[(CI_i - CI^*-)^2, (CI_i - CI^*+)^2] \\ & \text{otherwise} \end{aligned}$$

With this relationship, a decision can be made for each incoming order as to the "Goodness Of Schedule" for that order at a point in time, such decision function representing the test for release of that order to the factory. In other words, one is not required to wait until the end of the test in order to know whether the order should be released or not. As soon as $e(t)$ drops below a threshold value, the test is stopped and the start date of the order modified.

FIGS. 3(A–F) provide several illustrative job profiles using the methodology of this invention. Specifically, In FIG. 3A, an order is shown whose Factory Profile falls well within the acceptable CI boundaries, i.e. zero error. Hence this job has passed the test and can be released. The profile curve of FIG. 3B shows a shop which is overloaded in the near term but less busy later on. This fact is detected early on since the error term indicates a poor continuity performance for the proposed start date. FIG. 3C illustrates an expected poor performance scenario throughout the test period. With this test, as soon as the error value drops below the threshold level the test stops and the start date is changed.

Figure 3A:
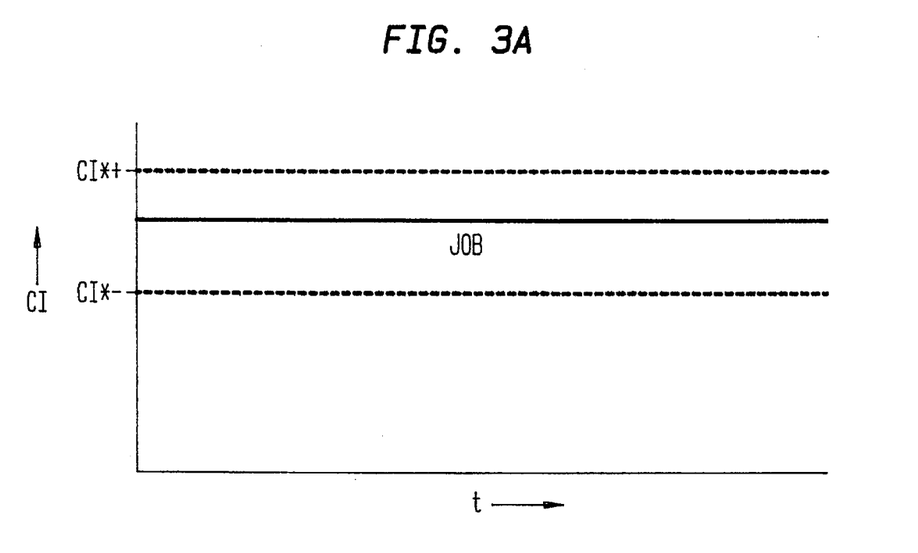
FIGS. 3A–3F illustrate several Factory Profiles for jobs being tested for release relative to an acceptable range of Continuity Index.
Figure 3B:
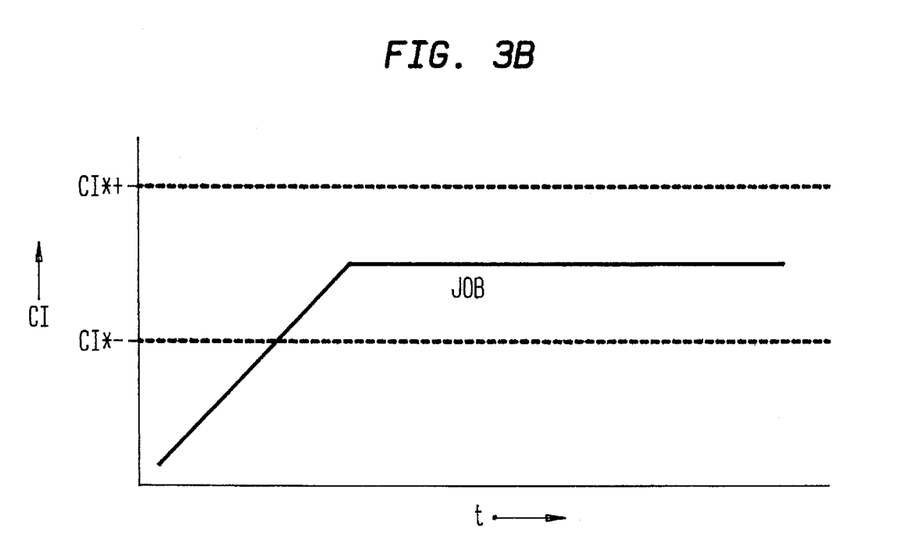
Figure 3C:
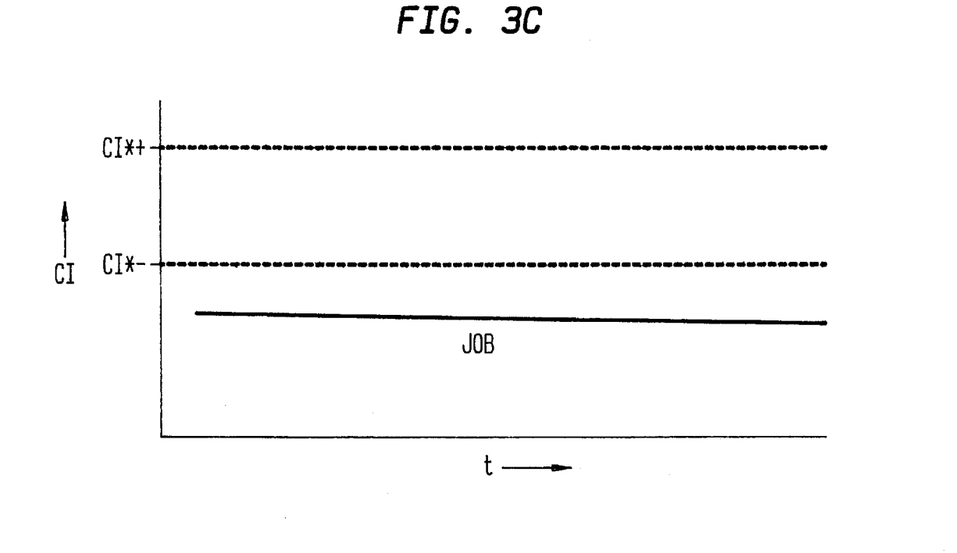
Figure 3D:
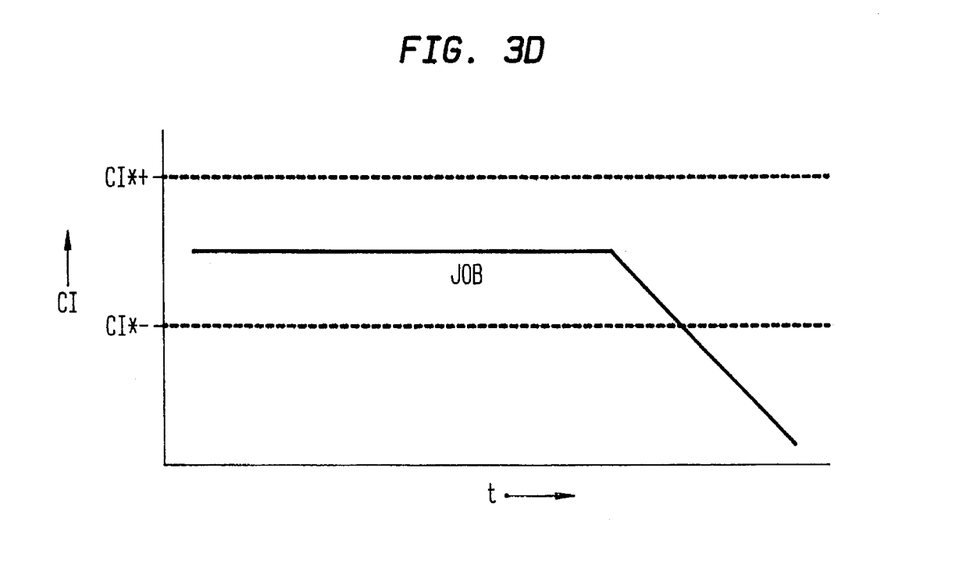
Figure 3E:
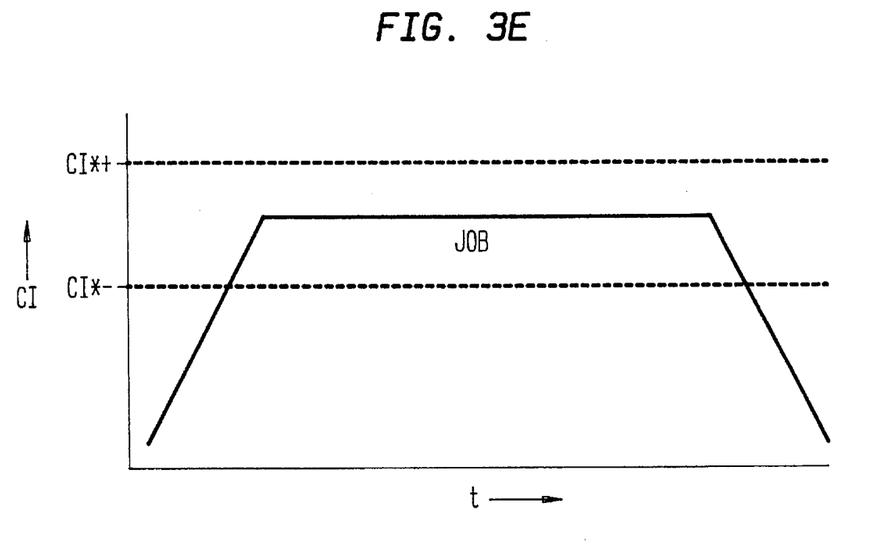
Figure 3F:
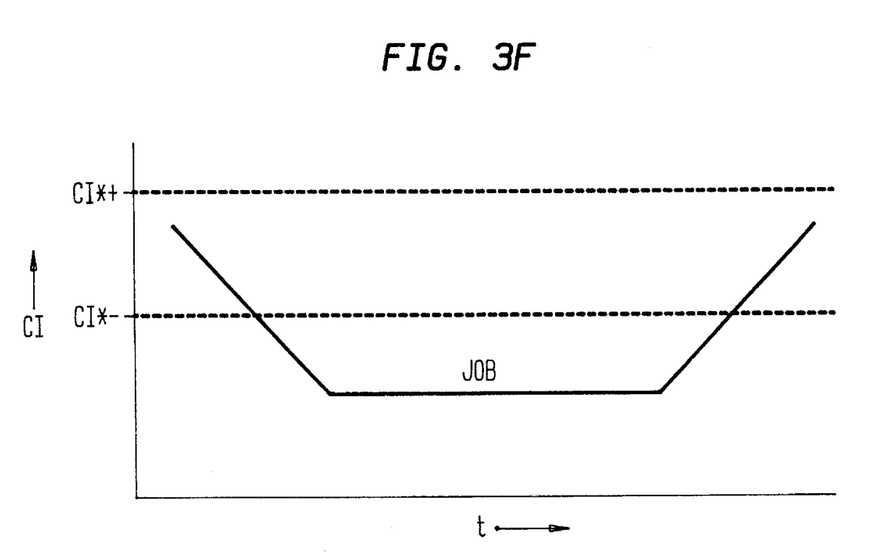
Figure 4:
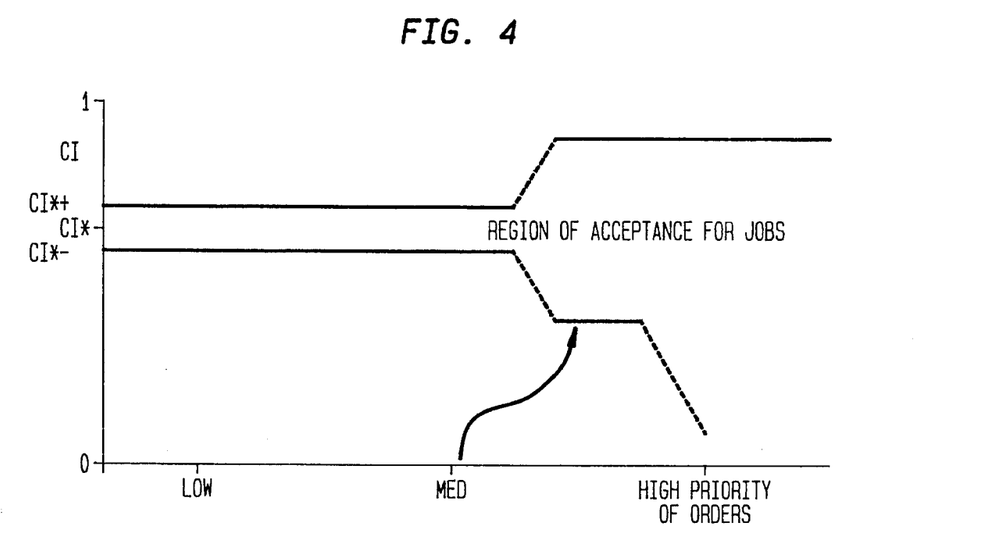
FIG. 4 depicts a curve of acceptable CI modified to account for order priority.

In FIG. 3D, good performance is indicated in the beginning of the test period, but poor continuity is projected near the end. Error value may drop to an unacceptable level at a later stage during the test. FIG. 3E illustrates a job profile which is poor at the beginning and end of the test period and within the acceptable range during the middle of the test, while FIG. 3F illustrates essentially the converse—i.e., acceptable performance at the beginning and end of the test and poor performance in between.

In the next section, an aspect of the invention is described for using the relation between CI and the priority value assigned to an order as a further refinement of the CI release strategy.

II. Continuity vs. Priority

As disclosed in the referenced patent, the concept of CI as a release strategy assumes that all jobs have the same priority. However, in many factory environments, some jobs will have a higher priority than others. The situation can be analogized to the role of the gatekeeper at a facility, such as the White House, which is open for visits by the public but is also an operating facility where those having business at the facility (hereafter referred to as "VIPs") must be given priority over the public visitors. In at least some cases, the VIPs must have access to the facility whenever they please whereas the visitors can only enter when such entry does not interfere with the normal operations of the facility. By admitting too many public visitors into the facility, it is theoretically possible that a relatively large number of people are asked to step aside and open the way for arriving VIPs. In order to avoid such public inconvenience and at the same time assure free access for the VIPs, it is necessary to manage the rate of entry by the public visitors. In order to make the gatekeeper "intelligent" enough to accomplish this management function, different values of CI* are composed for different entities using the facility. Entities with high priority are admitted without any real test of continuity because it is known that they will be processed continuously at the expense of others seeking to be processed. More "common" entities are admitted with the understanding that they might be required to stand aside for the processing of the VIPs.

Thus in an environment characterized by jobs of different priorities, even if a job with normal priority is tested for continuity and gets the maximum continuity rating a decision to release that job at that time may not be desirable; otherwise the job is promised a due date which may not be achievable for jobs of that priority. The reason could be the expected arrival of more important jobs, machine breakdowns, and so on.

From this, it will be apparent that a very high continuity index for a low priority job is no more than a very optimistic assumption. A more realistic continuity index is obtained by delaying the due date of that job. Returning to the gatekeeper analogy, a CI* is needed which is more than a horizontal line in order to address the different levels of priority which must be managed by the gatekeeper. This release strategy is functionally illustrated in FIG. 3.

Referring to the curve of FIG. 3, it can be seen that, under this release strategy, a much tighter control is made on jobs having low priority—i.e., a much narrower band of acceptable CIs, than for higher priority jobs. Indeed, for jobs with very high priority, hardly any control is imposed. The more high priority jobs are admitted, or expected, the narrower should be the bands of acceptable CI, and the lower the value of CI*, for release of normal priority jobs. Note, however, that too many high priority jobs would call for a review by management of its release strategy. As shown in the referenced patent, a lower CI* value implies more WIP and longer turn around time even for high priority jobs.

Derivation of the "normal" values of CI*+ and CI*− follows the methodology of the referenced patent for the CI release strategy. Therefore, for most lots—i.e., lots of normal priority, the desired values of CI*− and CI*+ can readily be determined. Furthermore for lots of very high priority it is obvious that CI ranges from 0 to 1. For most practical cases a CI-Priority curve of this kind would be adequate. However a more sophisticated version may be evolved from the basic curve described above by changing the shape of the curve from a step function to a more continuous horn shaped curve. The specific parameters of such a curve would be constructed interactively by the factory management.

In the following section, the use of this Factory Profile function, as constrained by the error function and priority considerations, is described in connection with a computational method for determining how to and by how much to shift the start date in order to achieve an acceptable Factory Profile, and thus determine an appropriate release time.

III. CI as a Search Guide

The Factory Profile examples of FIGS. 3A–3F illustrate the different cases that one may encounter while testing an order for release to the shop floor. These curves serve a number of useful purposes. One of their most important attributes is immediate feedback to the user. The profile function indicates how well the schedule of this order is expected to be in terms of both cost and meeting the due date of the order. Therefore, based on such a profile curve, the user may choose to abort the release or revise the scheduling for that job. However the profile function together with the defined error function can be employed more objectively so that the system itself can evaluate the release of the order. This information can then be used in order to either warn the user (if needed) and/or automatically change the release so that a better schedule is obtained. In this case, "better" would mean a profile function with a smaller error value. When an unacceptable error value results then the proposed start date of that order is not acceptable.

Under these circumstances a decision has to be made as to whether the start date should be moved forward, backward or undisturbed. Note that for purposes of applying this test procedure, the assumption is made that the options of adding shifts, preempting other orders, changing the routing, etc. have already been examined by the testing routine so that the only realistic change option is a revision of the start date.

Having established that the goal of the CI release strategy is to find a suitable start-date for an order, such that the required due date is met and, once the order is started, its waiting time is minimized, a methodology is now described (as a refinement of the well-known "branch and bound" procedure) to find the "best" start date of the order within the given constraints of CI*, priority due-date and finished-good inventory size. The latter two constraints are used to bound the search space whereas the former two are used to evaluate the "cost" function. The search is done by shifting the start date first left (on the time axis) then right. If the final solution is not acceptable, i.e. the cost penalty is too high, then provision is made to relax the constraints. The latter can be done either interactively by the user or, as a predefined procedure, by the system.

Methodologically, this "Best Start Date" determination is defined by the following algorithm:

"BestStartDate" Algorithm

Let Ethmax be maximum Threshold Error
Let Ethmin (E = Error) be minimum Threshold Error
Emin <− Eth
Emax <− 0 is the max error without going over the threshold value
Sd <− Desired_Sd (desired start date), SDc <− Sd, i.e. current Sd is originally set to the Desired_Sd
Nr, Nl no of right shifts and left shifts allowed
Nr is a function of order priority, i.e. as order priority increases then Nr becomes smaller; Nl is a management- "BestStartDate" Algorithm

```
    determined finished good inventory function, stating how
    early, in the worst case, completion of the order will be
    acceptable. Note that these two parameters decide on the
    boundaries of the search space. They can be either
    predefined or can be decided at the time of order entry.
    n is shift counter; +ve for right shifts & -ve for left
    shifts; n <- 0
    Wc is the current window_no
    w <- Wc
Allocate: Set t <- end_of(w) /* t is the max time unit in w,
e.g.,
                last day of week w */
    Allocate until t OR all steps done otherwise EXIT
    Evaluate e(t), where t is the end of current window
    If e(t) > Ethmin THEN
                BEGIN
                    if e(t) < Emin THEN BestSD <- SDc,
Emin <- e(t);
                    /*else the previous SD was better*/
                    find_a_better_sd;
                    auto allocate i
                END-begin
            ELSE /* error term is still smaller than
            threshold */
                BEGIN
                    w <- w+1
                    Emax <- e(t)
                    GOTO allocate
                END-begin;
    If e(t) > Ethmax    THEN warning: Promised due date is too
    good for this priority class;
    print(BestSD, Emin, Emax);
END BestStartDate.
PROCEDURE find_a_better_sd:
    If n=<0 & n>N1    THEN shiftleftORright(-)
                        /* note that N1 is a -ve number */
        Else IF n<Nr    THEN shiftleftORright(+);
                    ELSE /* UNSUCCESSFUL release */
    DO ONE OF THE FOLLOWING
        Increase job's priority; not recommended if done too often;
        Decrease job's priority, i.e., increasing Nr the search
        space this is relaxing constraints;
        Decrease(make more negative) N1, this is also relaxing WIP
        constraint;
        Suspend release until a later time;
        Other alternatives are changing Eth and CI* etc but these
        are not recommended since they would have a global effect.
        END-else;
END_find_a_better_sd.
PROCEDURE shiftleftORright (¯): /* ¯ is - if shiftleft and + if
shiftright */
    n <- n¯1
    w <- w¯1
    Wc <- w
    SDc <- max(starttime(w), Today)
END shiftleftORright.
```

In the remaining sections experimental results of using the refined CI release strategy with well-known job dispatch methodologies and other job release techniques are described, along with such results as related to job mix.

IV. CI and Dispatch Rules

Dispatching rules and their effectiveness in producing sensible schedules have received a great deal of attention in the literature. See, for example, C. R. Glassey & M. G. C. Resende, *Closed-Loop Job Release Control For VLSI Circuit Manufacturing, IEEE Transactions On Semiconductor Manufacturing*, Vol. 1, No. 1, pp. 36–46, 1988. A common way to dispatch lots is with the use of a priority dispatching rule, i.e., selection of the lot with the highest priority. Simple rules are available for some objectives. For example, shortest processing time (SPT) is often used as a sequencing strategy to minimize the average cycle time. Cycle time is defined to be the time a job spends in the shop, i.e., processing time plus waiting time. Minimization of cycle time, and consequently waiting time is vital in reducing the in-process inventory and improving the response time to changes in the demand pattern. Glassey, et al. (cited above) suggests, however, that job release control plays a much more significant role than dispatching in terms of reducing the cycle time. To investigate this hypothesis further, an experiment was undertaken, along with the use of simulation to compare the performance of the well-known dispatching rules—i.e., FIFO and SPT, with or without controlling the release of jobs by CI.

A job shop with 6 machines was selected for the test. Average cycle time (ACT), was used as the measure of the performance. First the simulation was performed with 10 jobs and then repeated for 20, 30, . . . , and 100 jobs. The processing times were generated from uniform distributions (10,100) for the first, second and sixth machines, (20,200) for the third machine (bottleneck), and (1,10) for the fourth and fifth machines. Furthermore, it was assumed that all jobs had 6 operations (with the conditions of at least one operation on each machine), but the order in which the machines were visited was decided randomly. In the controlled shop the optimum range for CI was assumed to be between 0.2 and 0.7 (as shown in the referenced patent).

Figure 5:
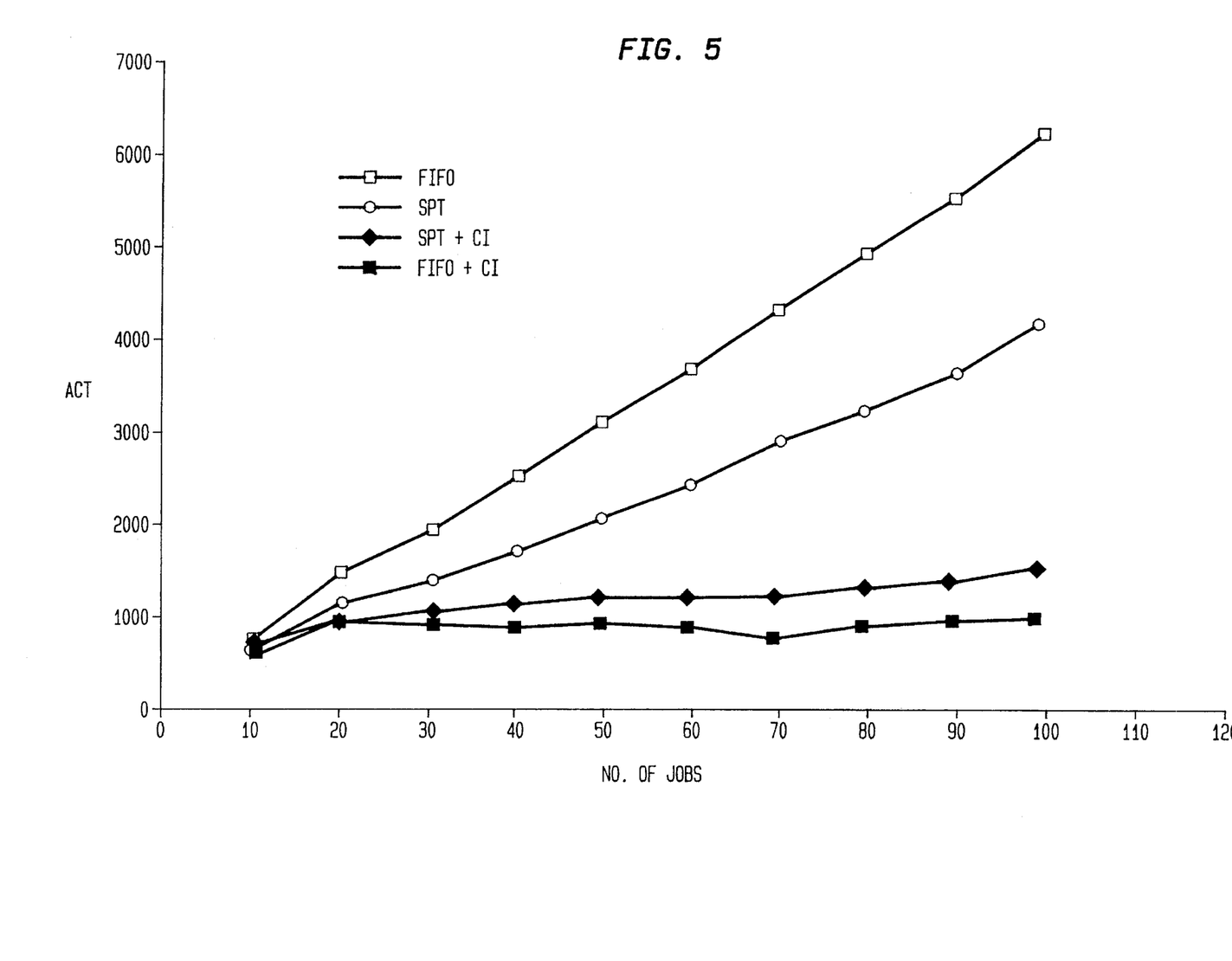
FIG. 5 shows a comparison of the effects of the job-scheduling method of the invention vs. other known scheduling methods on the average cycle time in the controlled and uncontrolled shop.

As illustrated in FIG. 5, the test results for the uncontrolled shop were quite predictable. They confirm the effectiveness of SPT in reducing the average cycle time in the absence of any control schemes. It should be pointed out, however, that the obvious drawback of SPT is the possibility of longer waiting times for the jobs which require longer processing times. The common cure of this deficiency is setting a limit on the job waiting time in the queue to avoid delaying it indefinitely. Note that even though SPT's performance is superior to FIFO, the average cycle time is still increasing as the number of jobs in the shop is increased. On the other hand as is depicted in the lower curves of FIG. 5, when the shop is controlled by CI, the average cycle times are reduced substantially (with either SPT or FIFO). A more interesting observation is that the combination of CI and FIFO produce smaller average cycle times than CI and SPT. In fact as more jobs are introduced, with CI and SPT, the average cycle time is bounded while with CI and FIFO, the average cycle time is increasing linearly but at much lower rate than in the uncontrolled shop. The shortcoming of SPT in handling larger jobs properly, affects the performance of CI and results in the longer average waiting time. Since SPT is rushing smaller jobs, larger jobs tend to get stuck (i.e. wait for a log-time) in front of bottleneck machines contrary to CI's prediction when the large job was first released.

V. CI and Other Job Release Techniques

In contrast to the dispatch rules, the literature on job shop scheduling makes little reference to job release control. Most research in the past has assumed job release to be random, commonly a Poisson process. Recently the importance of input-output control has been discussed in few studies (See W. Bechte, *Controlling Manufacturing Lead Time and Work-in-Process Inventory by Means of Load-Oriented Order Release*, Proc. of the American Production and Inventory Control Society Conf., pp. 67–72, 1982; O. W. Wight, *Input-Output Control, A Real Handle on Lead Time Production and Inventory Management*, 3rd Quarter, pp. 9–31, 1970; J. A. Buzacott, *The Production Capacity of Job Shops with Limited Storage Space*, Int. J. Prod. Res., vol. 14, no. 5, pp. 597–605, 1976). The most common release strategy suggested is the open loop strategy of UNIFORM starts, i.e., release new work into the shop at a constant rate equal to the desired output rate, and independent of current inventory levels or machine status. A second release method is the FIXED-WIP rule, which starts a new lot whenever an existing lot is completed. A variation on the FIXED-WIP rule has also been proposed in which inventory is measured, not by counting lots, but by summing the remaining work to be performed at the bottleneck work station. This strategy releases lots containing the equivalent of 1 hour of work at the bottleneck whenever a bottleneck machine completes 1 hour of work.

While these approaches suggest that controlling the number of jobs in the pipeline from start to finish can lead to a reduction in work-in-process, they fail to fulfill other requirements such as due-date promises. Furthermore, they tend to overlook dynamic constraints, such as moving bottlenecks, changes in the demand pattern and equipment status. As was in the shown in the referenced patent, the goodness of CI (by utilizing the CI index) is in it's global approach, i.e., its concern with the overall status of the resources rather than with a specific bottleneck. To verify these points, simulation studies were performed comparing the performance of CI and the following scheduling policies: NO-CONTROL, UNIFORM and FIXED-WIP. The results are described hereafter.

The job shop model used in these experiments was based on the use of 6 machines with processing times of 10, 10, 20, 1, 1 and 10 minutes for machines 1 through 6 respectively. The dispatching discipline applied was FIFO in all of the experiments. The following indicators were collected to compare the effects of different release schemes; PDD (fraction of jobs on time), MU (machine utilization), PDD× MU, ACT (average cycle time), TL (total lateness), AL (average lateness), WCOST (WIP cost=N×ACT, where N is the number of jobs), NS (number of steps completed vs. time) and NJ (number of jobs completed vs. time). The experiments comprised 100 jobs (i.e. N=100), were based on an assumption that all jobs had the same due dates (calculated from their release times) and that all jobs were available at time 0 (mainly because of the similarity in the results obtained when number of jobs and/or arrival patterns were varied).

Release control policies were exercised as follows. Size of WIP in the FIXED-WIP experiments was varied from ½ BC to BC, 3/2 BC and 2 BC (where BC is the capacity of the bottleneck machine,—in other words BC is the number of jobs that machine 3 can process in a 960 minute work day). Several UNIFORM input rates were examined ranging from ¼ TP to ⅓ TP, ½ TP, TP, 3/2 TP and 2TP (where TP is the total processing time of a job, excluding the waiting time). In the CI experiment, the optimum range for CI was predetermined using the methodology of the referenced patent and used to check the qualification of each job for release. Finally, in the NO-CONTROL experiment, all jobs were released in the beginning of the simulation run. The experimental results are illustrated in Table 1 (bold numbers indicating the best values in each column) and in FIGS. 6 and 7. Note that the results reported for FIXED-WIP are from the experiment with the size of WIP equal to 1/BC and those for the UNIFORM are based on the input rate equal to ⅓ TP. This selection is made because those experiments produced better outcomes than the other FIXED-WIP and UNIFORM studies.

TABLE 1

| POLICY | Simulation Results For Different Release Control Policies |  |  |  |  |  |  |
|---|---|---|---|---|---|---|---|
|  | PDD | MU | PDD × MU | ACT | TL | AL | WCOST |
| FIXED-WIP | 61 | 42.25 | 2601.71 | 445.90 | 532 | 13.64 | 44590 |
| UNIFORM | 87 | 42.17 | 3669.10 | 305.94 | 361 | 27.77 | 30594 |
| NO-CONTROL | 3 | 42.33 | 127.00 | 1116.10 | 61650 | 635.57 | 111610 |
| CI | 100 | 42.65 | 4265.09 | 254.41 | 0 | 0 | 25441 |

Table 1. shows that CI outperforms the other release strategies with respect to all the performance measures selected. Specifically, this suggests that CI can be expected to complete all jobs on time (zero lateness), produce the smallest average cycle time and maintain a high level of machine utilization all at the same time. UNIFORM seems to be more effective than FIXED-WIP, but both perform much better than NO-CONTROL. This confirms the expectation that a shop can receive great benefits from having a smooth input (notice the small value of PDD and the large values of ACT, TL and WCOST in the NO-CONTROL case). Interpretation of FIGS. 6 and 7 lead to the same conclusions. That is, CI, followed by UNIFORM and FIXED-WIP, appears to limit and balance work-in-process better than the NO-CONTROL policy. The controlled shop (CI first in the rank), has a uniform and higher output as time increments, even though fewer steps are completed. The controlled shop tends to be overcrowded in the early stages without being able to finish jobs until much later. Plainly, CI achieves major improvements over other release policies.

VI. CI and Job Mix

At this point it has been shown that by utilizing an appropriate order release tool such as CI in a job shop, among other improvements, the work-in-process can be controlled with the result that dispersion of lead times can be reduced. Consequently, there will be less competition among the waiting orders and complex dispatching decisions become more and more unnecessary. Nonetheless, it has been suggested that input control may make scheduling less effective by restricting the set of jobs available for scheduling and removing some options that would otherwise be available (see, for example, K. R. Baker, *The Effects of input Control in a Simple Scheduling Model*, Journal of Operations Management, vol. 4, no. 2, pp. 99–112, 1984). Accordingly, an examination was undertaken of a job mix strategy using CI to compensate for any such deterioration in scheduling performance. Using a simple model it can be seen that CI can well interact with order mix to determine the balance of load among the work centers according to the available capacities, as well as accomplishing even higher work center utilization and achieving a rapid and on-time flow of orders through the job shop.

For purposes of this analysis, the model is assumed to consist of 3 machines and a random mix of two sets of orders. The machines required to process the first set of orders are Nos. 1 and 2 and those for the second set of orders are Nos. 1 and 3. Further, the processing times on machines 1 through 3 are assumed to be 10, 20 and 20 minutes respectively—note the shorter processing time on the first machine and the longer one on the second machine. If CI is applied to control the release of the jobs in this shop, underutilization of one of the machines 2 or 3 might be expected to occur. Because "pure" CI contemplates that jobs in the shop queue are processed in the order of their arrivals, at the release time for a particular job, it might not be qualified because it's second operation is on a machine with no capacity left. The CI job mix strategy cures this problem by searching for the right candidate in the pool of the waiting jobs. In the example case, this would require skipping over a number of jobs till one can be found with the second operation on the starving machine.

Figure 8:
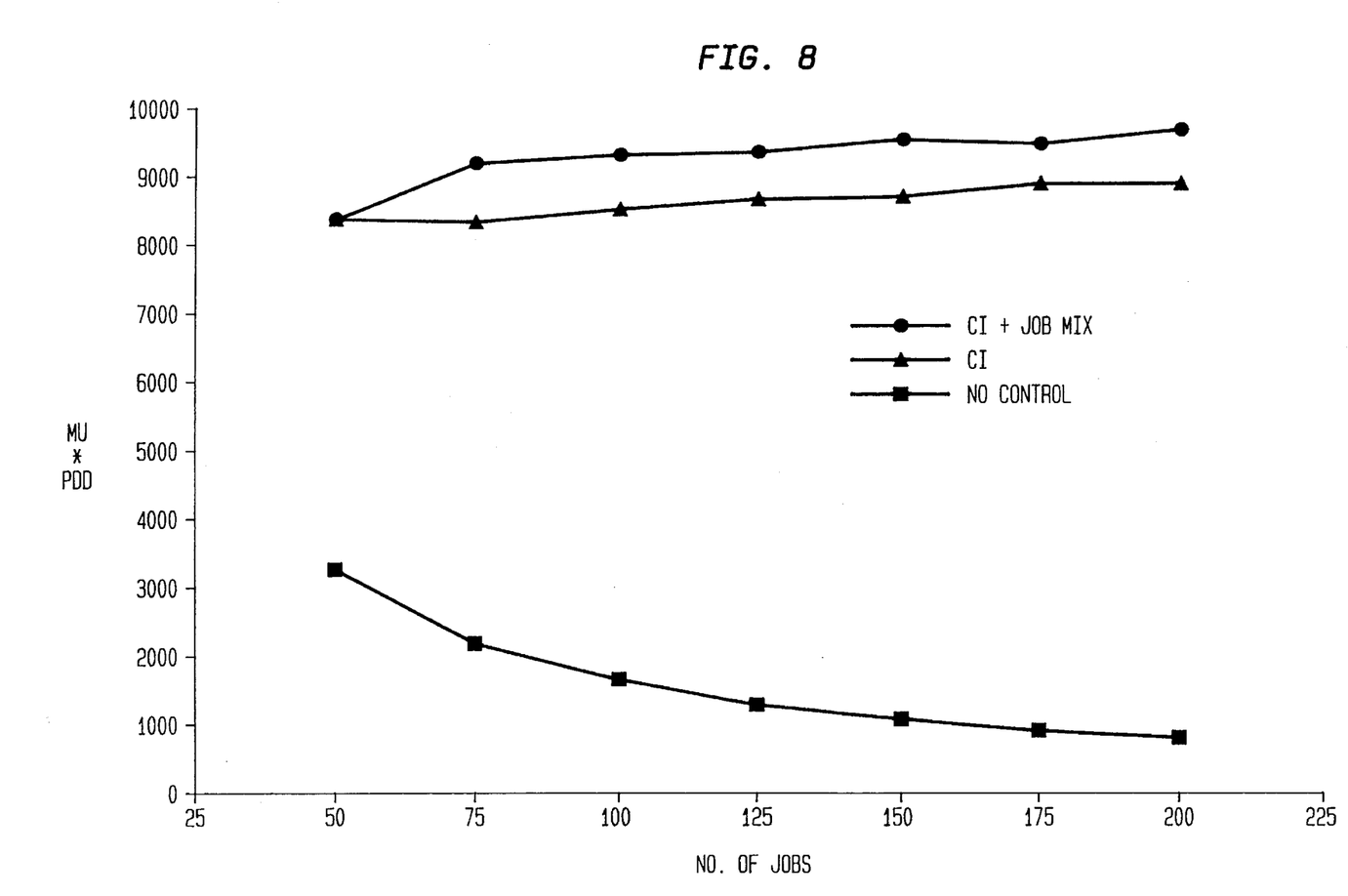
FIG. 8 shows the effect of a job mix strategy for the method of the invention on the product of machine utilization and the fraction of orders on time.
Figure 9:
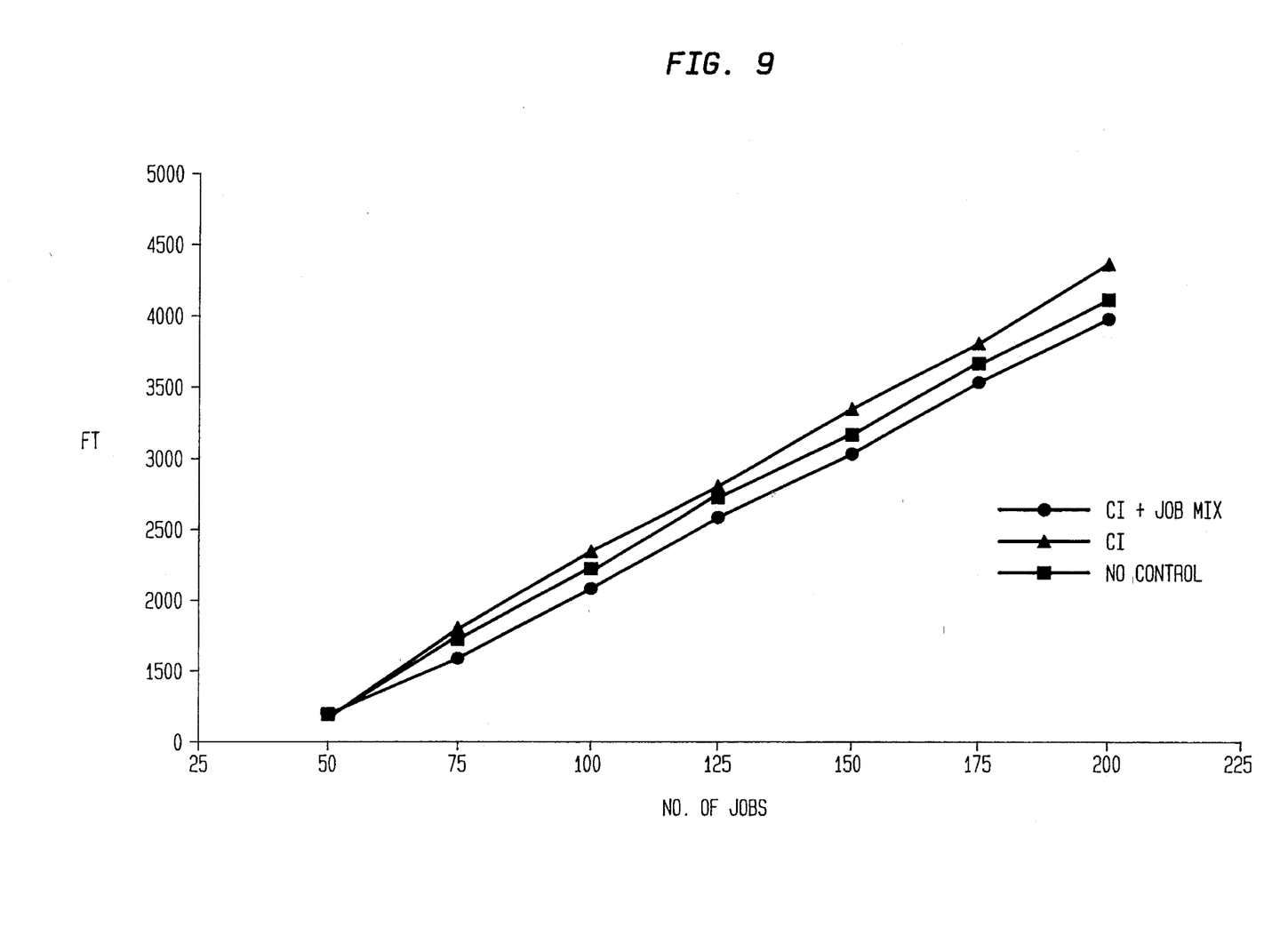
FIG. 9 shows the effect of a job mix strategy for the method of the invention on order finish time.

FIGS. 8 and 9 depict the results of the experiments using the above model. In these experiments the number of jobs ranged from 50 to 200. FIG. 8 shows that machine utilization×fraction of orders on time (MU×PDD) is higher for the combination of CI and it's job mix strategy than CI by itself. This result is predictable since the combination keeps the machines busier while both the combination and CI alone perform well in finishing the jobs on time. NO-CONTROL on the other hand, as expected, maintains a high level of MU with a low level of PDD. FIG. 9 indicates that CI+JOB MIX can help in reducing the finishing time of all the jobs.<<<MARK>>>

Figure 6:
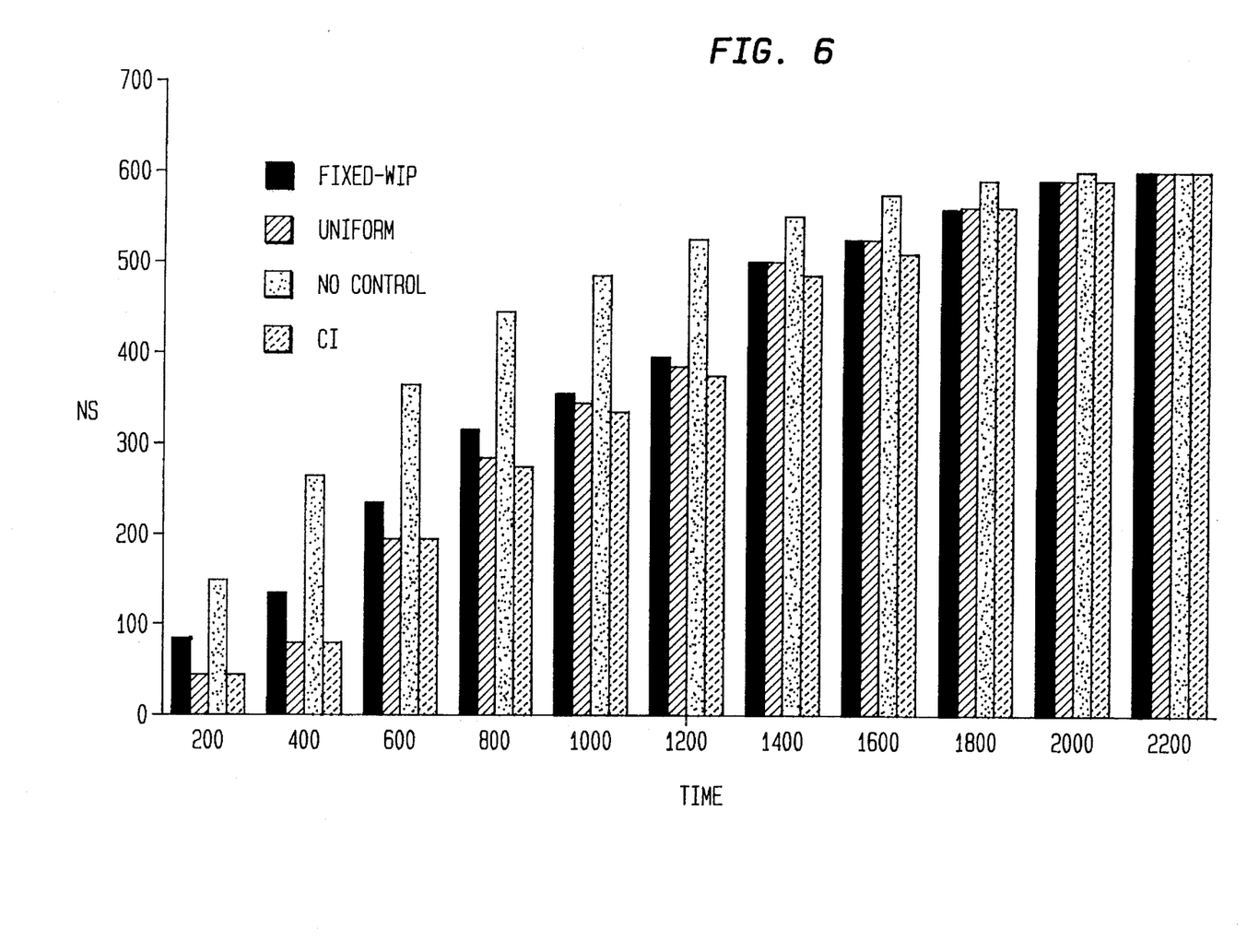
FIG. 6 shows a comparison of the effects of the method of the invention and other release control schemes on the number of steps completed in the job shop.
Figure 7:
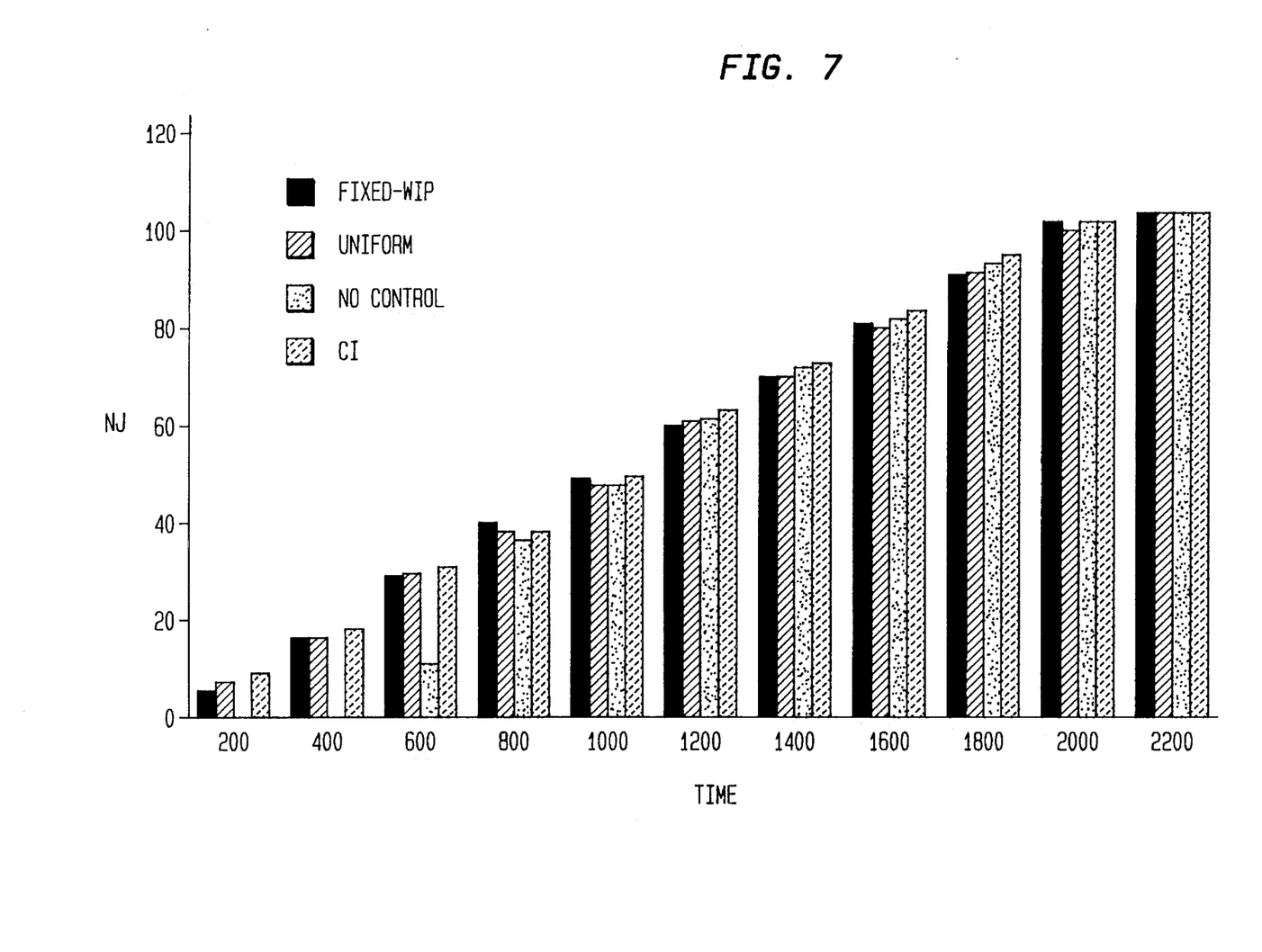
FIG. 7 shows a comparison of the effects of the method of the invention and other release control schemes on the number of jobs completed in the job shop.
Figure 10:
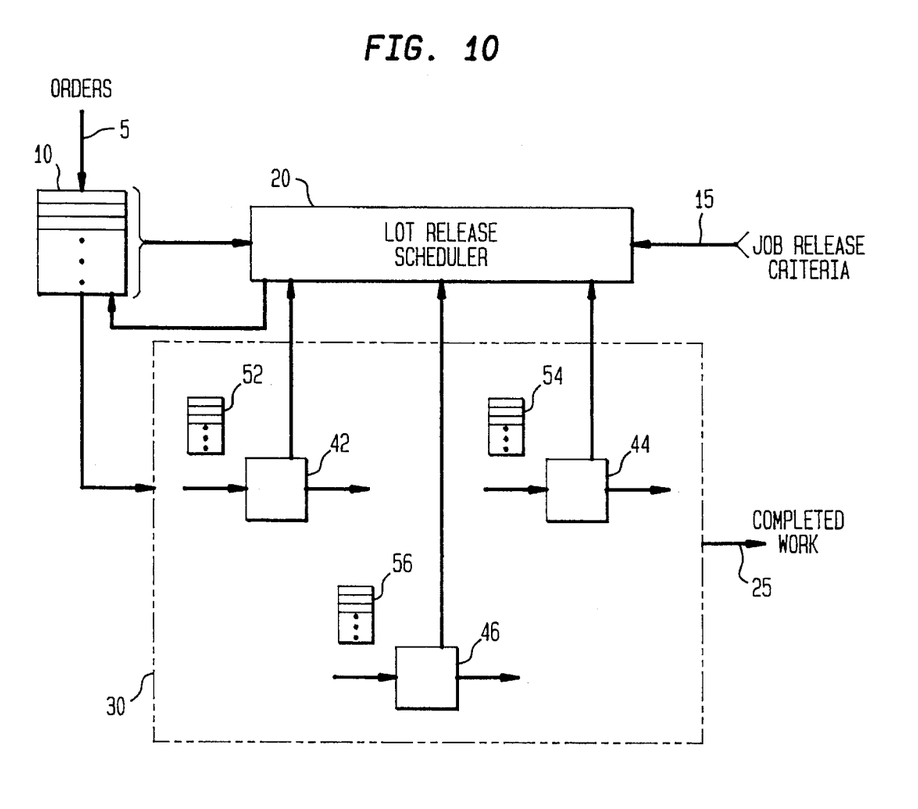
FIG. 10 is a block diagram of a factory implementing the methodology of this invention.

As will be understood the method of this invention can be readily implemented in a factory. FIG. 10 is a block diagram representing such a factory—such as a job-shop, in which jobs are allocated to machines in random order, or a flow shop, in which jobs are allocated to machines in the same order for each lot of WIP. As illustrated in FIG. 6, orders are received from customers at an input terminal 5. The orders received are saved in a job pool 10. Information about all of the orders in job pool 10 is supplied to a lot release scheduler 20. The lot release scheduler 20 controls which of the available pending jobs in job pool 10 is next to be released into the factory. The released order is supplied to the show floor 30. Shop floor 30 includes a plurality of machines, represented in FIG. 6 by machines 42, 44 and 46, which are processing jobs-in-progress. (The shop floor may, of course, include more than the three machines illustrated in FIG. 6.) Individual lots of WIP are routed among the machines by known lot dispatching methods. Completed work leaves the shop floor, as indicated by output terminal 25. This work may be sent to a shipping dock (not shown) whence it will be shipped to the ordering customer.

During the lot dispatching, certain machines may develop waiting queues in front of them. These machines may be deemed bottlenecks. It has been found that the throughput of a factory is limited by such bottlenecks. The waiting queues for the illustrated machines 42, 44 and 46 are represented by the lists 52, 54 and 56, respectively. The state of the queues may be reported to the lot release scheduler 20 by the machines 42 to 46. (Other information may also be reported to the lot release scheduler 20 from the machines 42 to 46, such as whether the machine is currently inoperative or when it is to be shut down for preventative maintenance.) In addition, job release criteria, from, for example, management personnel, represented by input terminal 15, are supplied to the lot release scheduler 20. Management criteria may, for example, include machine utilization and job on-time objectives.

In operation, the lot release scheduler 20 analyses the information supplied to it, according to the method of the present invention, and either releases a job which will most likely result in fulfilling the management objectives or does not release any job.

Herein, an improved system and method for optimizing the scheduling of jobs in a factory, such as a job-shop or flow-shop type factory based on the use of a continuity index job release strategy, and particularly to the application of the disclosed methodology for load balancing, early pruning and job searching has been described. Although the present embodiment of the invention has been described in detail, it should be understood that various changes, alterations and substitutions can be made therein without departing from the spirit and scope of the invention as defined by the appended claims.

What is claimed is:

1. A factory for processing jobs-in-progress, and producing completed work, said factory comprising:

a plurality of machines for receiving and processing ones of said jobs-in-progress and at least a portion of said plurality of machines having waiting queues, said machines providing status information relating to respective ones of said waiting queues;

a source of orders;

a source of user-selected job release criteria, said criteria including at least one of a respective utilization factor and a respective job on-time factor assigned to respective ones of said machines;

storing means, responsive to said source of orders, for storing pending orders, and for releasing a selected order for inclusion in said jobs-in-progress in response to selection information; and means, responsive to information from said storing means, to said source of job release criteria and to said machine status information, for producing and revising said selection information so as to establish a Factory Profile curve of an optimum release strategy for said factory, determining a corresponding curve of predicted actual processing for each of said jobs from a trial start date through the expected completion of said job in said factory, comparing said actual job curve for each of said jobs with said Factory Profile optimum curve, and accepting said job for processing by said factory on said trial start date if said actual job curve closely follows said Factory Profile curve, within predefined bounds, throughout the processing time for said job, and otherwise determining a new curve of predicted actual processing for said job from a new trial start date and repeating said comparison.

2. The factory of claim 1, wherein said selection information producing means further includes a means for determining a range enclosing said Factory Profile curve and wherein said acceptance criteria is satisfied if said actual job curve falls within said range enclosing said Factory Profile curve.

3. The factory of claim 2, wherein said selection information producing means further includes a means for adjusting said range about said Factory Profile curve to provide a wider range for jobs having a higher than normal priority.

4. The factory of claim 2, wherein said selection information producing means further includes a computational means for computing said start date for acceptance using a BestStartDate algorithm:

```
Let Ethmax be maximum Threshold Error
Let Ethmin (E = Error) be minimum Threshold Error
Emin <- Eth
Emax <- 0 is the max error without going over the
threshold value
Sd <- Desired_Sd (desired start date), SDc <- Sd, i.e.
current Sd is originally set to the Desired_Sd
Nr, Nl no of right shifts and left shifts allowed
Nr is a function of order priority, i.e. as order priority
increases then Nr becomes smaller; Nl is a management-
determined finished good inventory function, stating how
early, in the worst case, completion of the order will be
acceptable. Note that these two parameters decide on the
boundaries of the search space. They can be either
predefined or can be decided at the time of order entry.
n is shift counter; +ve for right shifts & -ve for left
shifts; n <- 0
Wc is the current window_no
w <- Wc
Allocate: Set t <- end_of(w)    /* t the max time unit in w,
e.g.,
                        last day of week w */
        Allocate until t OR all steps done otherwise EXIT
        Evaluate e(t), where t is the end of current window
        If e(t) > Ethmin THEN
                BEGIN
                    if e(t) < Emin THEN BestSD <- SDc,
                    Emin <- e(t);
                                    /*else the previous SD was better*/
                                    find_a_better_sd;
                                    auto allocate i
                END-begin
                ELSE /* error term is still smaller than
                threshold */
                BEGIN
                    w <- w+1
                    Emax <- e(t)
                    GOTO allocate
                END-begin;
If e(t) > Ethmax       THEN warning: Promised due date is too
good for this priority class;
print(BestSD, Emin, Emax);

END BestStartDate.
PROCEDURE find_a_better_sd:
    If n=<0 & n>Nl      THEN shiftleftORright(-)
                             /* note that Nl is a -ve number */
    Else IF n<Nr        THEN shiftleftORright(+);
                             ELSE /* UNSUCCESSFUL release */
    DO ONE OF THE FOLLOWING
        Increase job's priority; not recommended if done too often;
        Decrease job's priority, i.e., increasing Nr the search
        space this is relaxing constraints;
        Decrease(make more negative) Nl, this is also relaxing WIP
        constraint;
        Suspend release until a later time;
        Other alternatives are changing Eth and CI* etc but these
        are not recommended since they would have a global effect.
        END-else;
END_find_a better_sd.
PROCEDURE shiftleftORright (~): /* ~ is - if shiftleft and + if
shiftright */
n <- n~1
w <- w~1
Wc <- w
SDc <- max(starttime(w), Today)
END shiftleftORright.
```

5. The factory of claim 2, wherein said selection information producing means comprises a computer.

6. The factory of claim 2, wherein said order storing means comprises a data base stored on a computer.

7. The factory of claim 2, wherein said selection information producing means and said order storing means are comprised on the same computer.

8. The factory of claim 2, wherein said machines are controlled by a computer system directly connected to said information producing means and order storing means computer.

* * * * *